United States Patent
Lee et al.

(10) Patent No.: US 6,351,839 B1
(45) Date of Patent: Feb. 26, 2002

(54) STATE METRIC MEMORY OF VITERBI DECODER AND ITS DECODING METHOD

(75) Inventors: Seung Hwan Lee; Jong Youn Kim, both of Kyungki-do (KR)

(73) Assignee: LG Information & Communications, Ltd., Seoul (KR)

( * ) Notice: Subject to any disclaimer, the term of this patent is extended or adjusted under 35 U.S.C. 154(b) by 0 days.

(21) Appl. No.: 09/222,345

(22) Filed: Dec. 29, 1998

(30) Foreign Application Priority Data

Jan. 22, 1998 (KR) ............................................. 98-1907

(51) Int. Cl.[7] .............................................. H03M 13/03
(52) U.S. Cl. ........................................ 714/795; 714/796
(58) Field of Search ................................. 714/795, 796, 714/794; 375/341

(56) References Cited

U.S. PATENT DOCUMENTS

| | | | | |
|---|---|---|---|---|
| 4,979,175 A | * | 12/1990 | Porter | 714/795 |
| 5,272,706 A | * | 12/1993 | Park | 714/796 |
| 5,295,142 A | * | 3/1994 | Hatakeyama | 714/795 |
| 5,881,075 A | * | 3/1999 | Kong et al. | 714/795 |
| 5,970,104 A | * | 10/1999 | Zhong et al. | 375/341 |

* cited by examiner

Primary Examiner—David Ton
(74) Attorney, Agent, or Firm—Fleshner & Kim, LLP

(57) ABSTRACT

An apparatus and method of a state metric memory for a viterbi decoder is disclosed including generating survival path metrics from the current-state metrics and simultaneously storing at least two next-state metrics designated by control signals. The present invention includes a plurality of submemories in a memory unit wherein each submemory stores both the current-state metrics and the next-state metrics.

27 Claims, 5 Drawing Sheets

STATE METRIC MEMORY OF VITERBI DECODER AND ITS DECODING METHOD

BACKGROUND OF THE INVENTION

1. Field of the Invention

The present invention relates to a digital communication system, and more particularly to a state metric memory of a viterbi decoder for a digital communication system.

2. Discussion of Related Art

Generally, a viterbi decoder is frequently used in a transmission-reception apparatus for decoding via an optimal path in fields of a satellite communication and a digital communication. The viterbi decoder is a fairly recent technique and is shown in FIG. 1(a). The viterbi decoder generally includes a branch metric calculator 10 calculating branch metrics from received code symbols and voluntary hypotheses by using a look-up table; an adder/comparator/selector (ACS) 20 adding the branch metrics and the current-state metrics, comparing path metrics, and selecting an optimal path metric; a memory 30 reading and writing the current-state metrics and the next-state metrics; and an address generator 40 selectively generating control signals for designating addresses of the memory to read and write the current or next-state metrics.

In a viterbi decoding method, a trellis diagram is built for all the transmitted code symbols. In the trellis diagram, the distance values of each node corresponding to input data are calculated and the distance values for each potential paths for decoding are accumulated. The path having a minimum accumulated distance value, i.e. the minimum evaluation quantity is determined to be a survival path.

The addresses of the viterbi decoder are generated through a process in which the current state metrics are read out from the memory according to a fixed period, thereby renewing the addresses for the next state metrics. Thus, the next state metrics are written into the renewed addresses of the memory.

To designate the optimal next-state metrics to be written according to the fixed period after the current-state metrics has been read, eight reading and writing operations must be executed. For example, (000,001→000), (010,011→001), (100,101→010), (110,111→011), (000,001→100), (010,011→101), (100,101→110) and (110,111→111) are executed in order to actively perform all state transitions as shown in the trellis diagram of FIG. 2.

The state metrics in the eight states generated through the above eight reading and writing operations are regarded as the current-state metrics and the eight reading and writing operations are repeated again for a set of next state metrics. For a smooth implementation of this repeated state exchange of the metrics, the memory must store, at any given point of time, all the current-state metrics read according to the fixed period and must also have memory space for storing the next-state metrics written according to the fixed period.

Thus, if the memory space capable of storing all the current-state metrics is N, the memory requires additional memory space of N for writing the next-state metrics. In other words, the memory space capacity must overall be 2N to completely accomplish the above repeated state exchange of the metrics.

The states in the trellis diagram of FIG. 2 are limited by a constraint length. The number of stages in the encoder, which is equal to one more than the number of delay elements, is known as the constraint length. Supposing that C is the constraint length, the states exist in a range between "0" and "$2^{c-1}$-1". Thus, the constraint length in the trellis diagram of FIG. 2 would be four resulting in eight states.

The operations of the state metric memory in the viterbi decoder as shown in FIG. 1(a) will be described in reference to FIG. 2. The memory 30 includes four submemories M100 to M400 as shown in FIG. 1(b). All four memories are necessary for the current-state metrics read according to the fixed period and the next-state metrics written according to the fixed period.

Particularly, the first and second memories M100, M200 are for the current-state metrics, and third and fourth memories M300, M400 are for the next-state metrics. After a conversion from the current-states to the next-states, as shown in FIG. 2, the first and second memories M100, M200 write the metrics of the next-states while the third and fourth memories M300, M400 read the metrics of the current-states.

Also, the address generator 40 includes a counter 41 and a controller 42 controlling the counter 41. The address generator 40 outputs control signals for designating a domain of the memory. The metrics of the first current-states 0=000 and 1=001, stored initially in the first and second memories M100, M200 are read by according to the control signals output from the address generator 40 and are input to the ACS 20.

Utilizing a look up table, the ACS 20 adds the branch metrics calculated from the code symbols and hypotheses transmitted within a fixed period, and the metrics of the current-states 0=000 and 1=001, respectively. The ACS compares summed path metrics of the metrics and selects an optimal path metric having the minimum evaluation quantity, thereby producing each path metrics. Such optimal path metric is the survival path metric and is written in the third memory M300 as the next-state '0=000.'

Upon completion of the above process, the address generator 40 reads the metrics of the following current-states 2=010 and 3=011, stored at the first and second memories M100 and M200, and writes a second survival path metric in the fourth memory M400 as the next-state '1=001' through the same process as the above process. Similarly, the remaining current-state metrics of the first and second memories M100 and M200 are read continuously according to a fixed period, and the selected survival path metrics are written according to the fixed period in the third and fourth memories M300 and M400, respectively, as the next-states through the process as discussed above.

During the process, the current-state metrics of the first and second memories M100 and M200 are read according to the control signals in a fixed period. The survival path metrics are sequentially written in the third M300 and fourth M400 memories as the next-states, thereby a first 8-state transition process is completed. FIG. 3 shows a sequential state transition process of the state metric memory based upon the conventional technique.

Referring to FIG. 3, the first eight current-state metrics are read from memories M100 and M200 by a fixed period, and are sequentially and alternately written into memories M300 and M400 by the fixed period. The eight current-state metrics are assigned to the next-state metrics by a designated sequence in a fixed period as follows {000 and 001→010 and 011→100 and 101→110 and 111→000 and 001→010 and 011→100 and 101→110 and 111}.

In assigning the current-state metrics, the first next-state metric of 0' is designated to assign the first current-state metrics 0=000 and 1=001 from the memories M100, M200 to the third memory M300. A second current-state metrics 2=010 and 3=011 from the memories M100 and M200 are designated to a second next-state metric 1' in the fourth memory M400. A third current-state metrics 4=100 and 5=101 from the memories M100 and M200 are designated to a third next-state metric 2' in the third memory M300. A fourth current-state metrics 6=110 and 7=111 from the memories M100 and M200 are designated to a fourth next-state metric 3' in the fourth memory M400.

The address generator 40 generates control signals to output the metrics of the first and second current-state metrics 0=000, 1=001 from the first and second memories M100, M200 in a predetermined order as discussed above and shown in FIG. 3(a) to (a').

Accordingly, a fifth current-state metrics 0=000, 1=000 from the memories M100, M200 are designated to a fifth next-state metric 4' in the third memory M300. A sixth current-state metrics 2=010, 3=011 from the memories M100, M200 are designated to a sixth next-state metric 5' in the fourth memory M400. A seventh current-state metrics 4=100, 5=101 from the memories M100, M200 are designated to a seventh next-state metric 6' in the third memory M300. An eighth current-state metrics 6=110, 7=111 from the memories M100, M200 are designated to an eighth next-state metric 7' in the fourth memory M400.

Upon completion of assigning the eight current-state metrics, the designated next-state metrics in the third and fourth memories M300, M400, namely 0'=000, 1'=010, 3'=011, 4'=100, 5'=101, 6'=110 and 7'=111 become the current-state metrics, and as current-state metrics repeat the above discussed process for designating a following set of next-state metrics. Because the next-state metrics become the current-state metrics at a certain point in time, the memory must store all the current-state metrics in the first and second memories M100, M200 as well as requiring additional memory domain with the same capacity as the first and second memories M100, M200.

In sum, in an initial state (a), the first and second memories M100, M200 already store metrics of the current-states 0,1,2,3,4,5,6,7, and alternately write the metrics of the next-states 0',1',2',3',4',5',6',7' to the third and fourth memories M300, M400 in a designated sequence. Upon completion of the writing the metrics of the next states as shown in part (a'), the roles of the memories change. Namely, the states of the third and fourth memories M300, M400 are changed to the current-states, and the states of the first and second memories M100, M200 are changed to accommodate the following next-states to repeat the reading and writing process.

As a result, in the state metric memory of the viterbi decoder according to the conventional art, both a memory space for storing the current-state metrics and a memory space for writing the next-state metrics is required. Thus, the total capacity of the memory space must be twice the space necessary to store the current-state metrics to correct errors of received code symbols and to decode via an optimal path.

The additional memory capacity requirements not only run counter to a lightness/thinness/simplicity characteristic trend in the communicative instruments of the communication fields, but also cause a cost increase especially in a mobile radio communication system requiring a memory of high speed and large capacity.

SUMMARY OF THE INVENTION

Accordingly, an object of the present invention is to solve at least the problems and disadvantages of the related art.

An object of the present invention is to provide a state metric memory of a viterbi decoder capable of simultaneously storing survival path metrics generated from current-state metrics and storing two next-state metrics.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

To achieve the objects and in accordance with the purposes of the invention, as embodied and broadly described herein, a state metric memory of a viterbi decoder comprises a calculating unit calculating a plurality of branch metrics from code symbols and hypotheses; a path generating unit producing each metric paths utilizing numerous state metrics of an initial state or a previous state and the branch metrics; a memory simultaneously storing current-state metrics read and next-state metrics written in the path generating unit; and a control unit providing the memory with address signals which control operations for reading and writing the current-state metrics and the next-state metrics.

In another embodiment of the present invention, a decoding method using a state metric memory of a viterbi decoder includes the steps of calculating a plurality of branch metrics from code symbols and hypotheses; producing each metric paths by utilizing numerous state metrics of an initial state or a previous state and the branch metrics; reading current-state metrics and writing next-state metrics, and simultaneously storing the metrics; and determining the stored state metrics as the current-state metrics and repeating the steps.

According to the present invention, a limited memory space is efficiently used and a communication system having a high-speed/large capacity can be processed without an additional memory capacity.

BRIEF DESCRIPTION OF THE ATTACHED DRAWINGS

The invention will be described in detail with reference to the following drawings in which like reference numerals refer to like elements wherein:

FIG. 1(b) shows a detail block diagram of the memory unit in FIG. 2a;

DETAILED DESCRIPTION OF PREFERRED EMBODIMENT

Reference will now be made in detail to the preferred embodiments of the present invention, examples of which are illustrated in the accompanying drawings.

Figure 4:
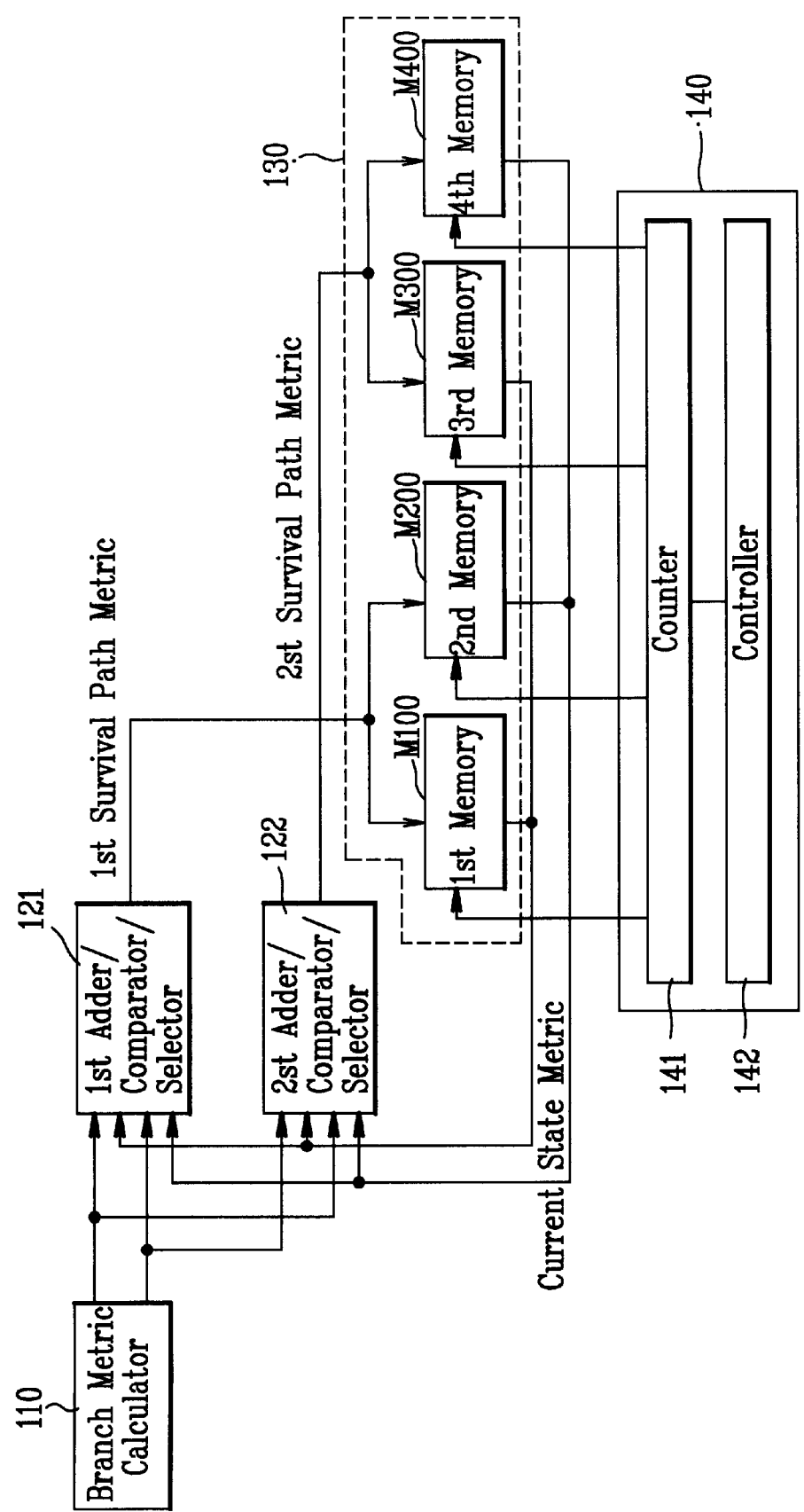
FIG. 4 is a preferred embodiment of a portion of a viterbi decoder according to the present invention.

FIG. 4 is a preferred embodiment of a state metric memory in a viterbi decoder according to the present invention comprising a branch metric calculator 110 calculating branch metrics from input code symbols and hypotheses using a look-up table; a first adder/comparator/selector (ACS) 121 and a second ACS 122 adding a combination of the branch metrics and the current-state metrics read according to control signals of a address generator 140 to make two path metrics, comparing the respective path metrics, and selecting an optimal path metric having the minimum evaluation quantity; a memory unit 130 simultaneously storing the current-state metrics read from the first and second ACS 121, 122 according to a fixed period and storing next-state metrics written according the fixed period; and an address generator 140 outputting the control signals to the memory unit 130, the control signals designating addresses for reading the current-state metrics and/or writing the next-state metrics to and from the memory unit 130.

The address generator 140 includes a counter 141 outputting the control signals to designate addresses for reading the current-state metrics and/or writing the next-state metrics.; and a controller 142 controlling the counter. Also, the memory unit 130 includes four memories M100 to M400, from which the current-state metrics are read and to which the next-state metrics are written according to the control signals from the counter 141.

The optimal path metrics selected in the first and second ACS 121, 122 are the survival path metrics. The survival path metric selected in the first ACS 121 is written as the next-state metric into either the first or second memories, M100, M200 designated by the control signal of the address generator 140. Simultaneously, the survival path metric selected in the second ACS 122 is written as the next-state metric into either the third or fourth memories, M300, M400. The outputs from the first, second, third and fourth memories M100 to M400 are fed back to the first ACS 121 and the second ACS 122.

Figure 5:
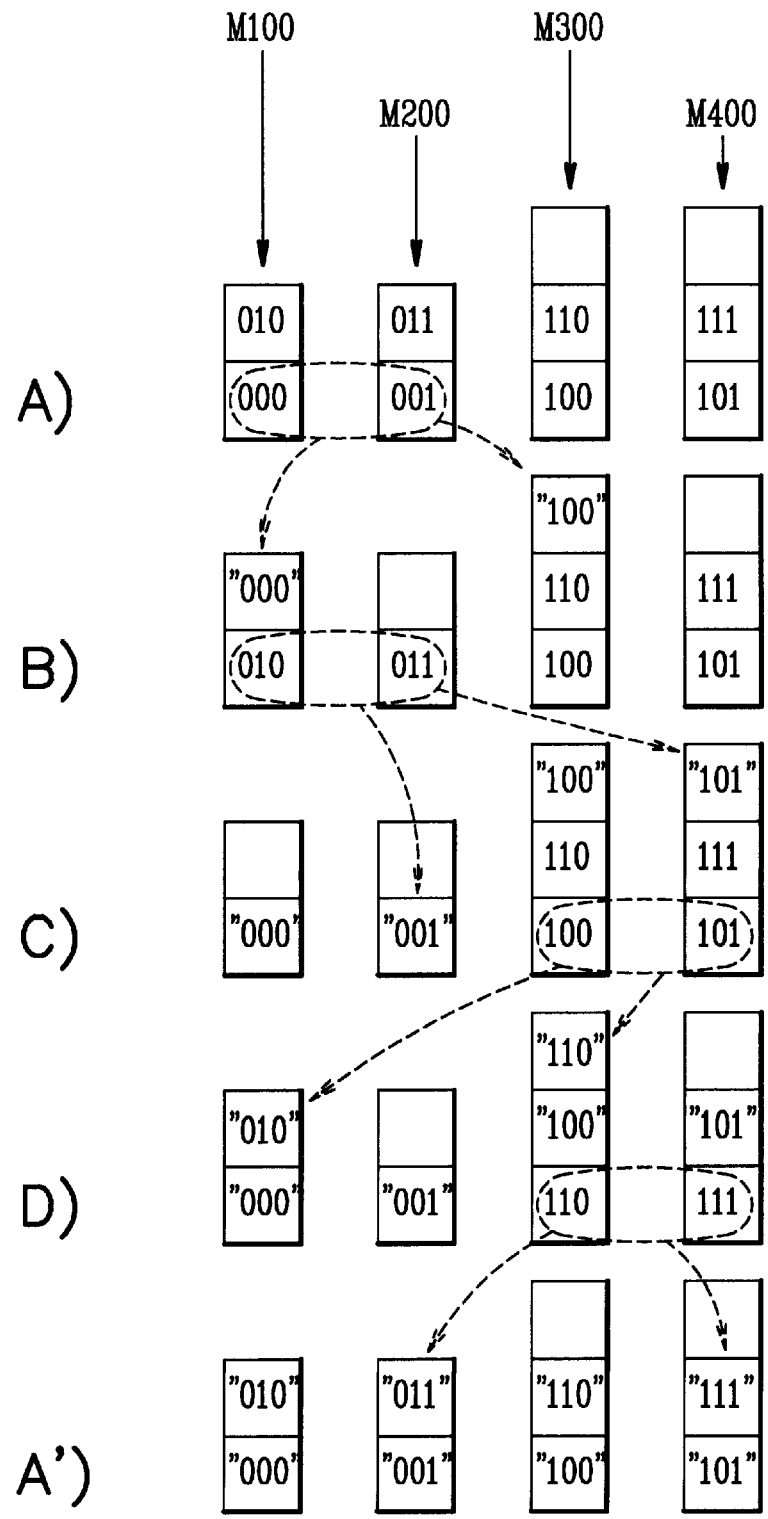
FIG. 5 is a diagram showing a sequential state transition process of a state metric memory (A) to (A') according to the present invention.

FIG. 5 is a diagram showing a sequential state transition process of a state metric memory according to the present invention. In the present invention, the current-state metrics are stored in both the first and second memories M100, M200 as well as the third and fourth memories M300, M400. First, the current-state metrics 000 and 001 stored in the first and second memories M100, M200 are added, compared and an optimal path metric is selected for both next-state 000' and 100'. The selected optimal path metrics are simultaneously written respectively on a designated next-state 000' in the first memory M100 and on a designated next-state 100' in the third memory M300. Similarly, the current-state metrics 010, 011 stored in the first and second memories M100, M200 are added, compared and an optimal path metric is selected for both next-state 001' and 101'. The selected optimal path metrics are simultaneously written respectively on a designated next-state 001' in the second memory M200 and on a designated next-state 101' in the fourth memory M400.

The current-state metrics 100, 101 stored in the third and fourth memories M300, M400 are added, compared and an optimal path metric is selected for both next-state 010' and 110'. The selected optimal path metrics are simultaneously written respectively on a designated next-state 010' in the first memory M100 and on a designated next-state 110' in the third memory M300.

Likewise, the current-state metrics 110, 111 stored in the third and fourth memories M300, M400 are added, compared and an optimal path metric is selected for both next-state 011' and 111'. The selected optimal path metrics are simultaneously written respectively on a designated next-state 011' in the second memory M200 and on a designated next-state 111' in the fourth memory M400. Upon completion of the process, the designated next-states, 000', 001', 010', 011', 100', 101', 110', 111' in each memories become current-states. The states of the memories M100 to M400 return to the initial states after a serial processing of the metric states. Thus, the process for writing the current-states on the designated next state metrics is repeated. A detailed operation of state metric memory in the FIG. 4 will follow in reference to FIG. 5.

For purposes of the explanation, assume the branch metrics produced from the input hypotheses and code symbols through a look-up table are AAA and aaa. Also, assume that the initial memories store metrics of current-states 000, 001, 010, 011, 100, 101, 110, 111, as shown in FIG. 5.

The current-state metrics 000,001 corresponding to the first and second-memories M100, M200 are read by the control signals of the address generator 140. The first ACS 121 adds the current-state metric 000 corresponding to the first memory M100 and the branch metric AAA. Simultaneously, the first ACS 121 adds the current-state metric 001 corresponding to the second memory M200 and the branch metric aaa. Two path metrics are produced by the summation and the paths are compared to select an optimal path metric having the minimum evaluation quantity.

Concurrently, the second ACS 122 also adds the current-state metric 000 corresponding to the first memory M100 and the branch metric aaa. Simultaneously, the second ACS 122 also adds the current-state metric 001 corresponding to the second memory M200 and the branch metric AAA. By the summation process, two path metrics are produced and the two path metrics are compared to select an optimal path metric having the minimum evaluation quantity.

The first optimal path metric selected by the first ACS 121 is written on a next-state 000' in the first memory M100 designated by the control signal of the address generator 140. Simultaneously, the second optimal path metric selected by the second ACS 122 is written on a next-state 100' of the third memory M300 designated by the control signal of the address generator 140. Upon writing the next-state 000' and 100', the state transition process of a first state metric memory is complete.

Next, the current-state metrics 010 and 011 corresponding to the first and second memories M100, M200 are read by the control signals of the address generator. The first ACS 121 adds the current-state metric 010 corresponding to the first memory M100 and the branch metric AAA, and simultaneously adds the current-state metric 011 corresponding to the second memory M200 and the branch metric aaa. Two path metrics are produced and are compared to select an optimal path metric having the minimum evaluation quantity.

Concurrently, the second ACS 122 adds the current-state metric 010 corresponding to the first memory M100 and the branch metric aaa, and simultaneously adds the current-state metric 011 corresponding to the second memory M200 and the branch metric AAA. By the summation process, two path metrics are produced and are compared to select an optimal path metric having the minimum evaluation quantity.

The optimal path metric selected by the first ACS 121 is written on a next-state 001' in the second memory M200 designated by the control signal of the address generator 140, and simultaneously the optimal path metric selected by the second ACS 122 is written on a next-state 101' in the fourth memory M400 designated by the control signal of the address generator 140. Thus, the state transition process of a second state metric memory is complete.

Thereafter, the current-state metrics 100,101 stored in the third and fourth memories M300, M400 are read by control signals of the address generator 140. The first ACS 121 adds the current-state metric 100 corresponding to the third memory M300 and the branch metric AAA, and simultaneously adds the current-state metric 101 corresponding to the fourth memory M400 and the branch metric aaa. Two path metrics are produced and are compared to select an optimal path metric having the minimum evaluation quantity.

Concurrently, the second ACS 122 adds the current-state metric 100 corresponding to the third memory M300 and the branch metric aaa, and simultaneously adds the current-state metric 101 corresponding to the fourth memory M400 and the branch metric AAA. Two path metrics are produced and are compared to select an optimal path metric having the minimum evaluation quantity.

The optimal path metric selected by the first ACS 121 is written on a next-state 010' in the first memory M100 designated by the control signal of the address generator 140, and simultaneously the optimal path metric selected by the second ACS 122 is written on a next-state 110' in the third memory M300 designated by the control signal of the address generator 140. Thus, the state transition process of a third state metric memory is finished.

Finally, the current-state metrics 110,111 corresponding to the third and fourth memories M300, M400 are read by control signals of the address generator 140. The first ACS 121 adds the current-state metric 110 corresponding to the third memory M300 and the branch metric AAA, and simultaneously adds the current-state metric 111 corresponding to the fourth memory M400 and the branch metric aaa. Two path metrics are produced and are compared to select an optimal path metric having the minimum evaluation quantity.

Also, the second ACS 122 adds the current-state 110 metric corresponding to the third memory M300 and the branch metric aaa, and simultaneously adds the current-state metric 111 corresponding to the fourth memory M400 and the branch metric AAA. Two path metrics are again produced by the summation process and are compared to select an optimal path metric having the minimum evaluation quantity.

The optimal path metric selected by the first ACS 121 is written on a next-state 011' in the second memory M200 designated by the control signal of the address generator 140, and simultaneously the optimal path metric selected by the second ACS 122 is written on a next-state 111' in the fourth memory M400 designated by the control signal of the address generator 140. Thus, the state transition process of a fourth state metric memory is complete.

Upon completion of the four state transition processes, the next-states of each memory designated by the control signals of the address generator 140 is considered as the new the current-state metrics stored initially at each memory, namely 000, 001, 010, 011, 100, 101, 110 and 111. Accordingly, the above serial state transition process is again repeated for the fixed period.

Through the state transition process, the errors of input code symbols in the viterbi decoder are corrected, and a code path having the most similar metric is selectively attained. As a result, the optimal state metric can be decoded through a final decoding path.

In the conventional technology, the current-state metrics output by a constant period must be stored at the memory unit. If a memory space capable of storing all current-state metrics is N, the same memory capacity N in a memory space for writing next-state metrics is required in the conventional technique.

In contrast, according to the present invention, for one reading of the current-state metric, two current-state metrics are read at the same time. Thus, the current-state metrics read need not be stored in the memory, thereby ensuring the memory space for writing the next-state metrics. Accordingly, if the memory space capable of storing the initial current-state metrics is N, a memory space of approximately (1/4)*N is sufficient to write the next-state metrics.

Figure 1A:
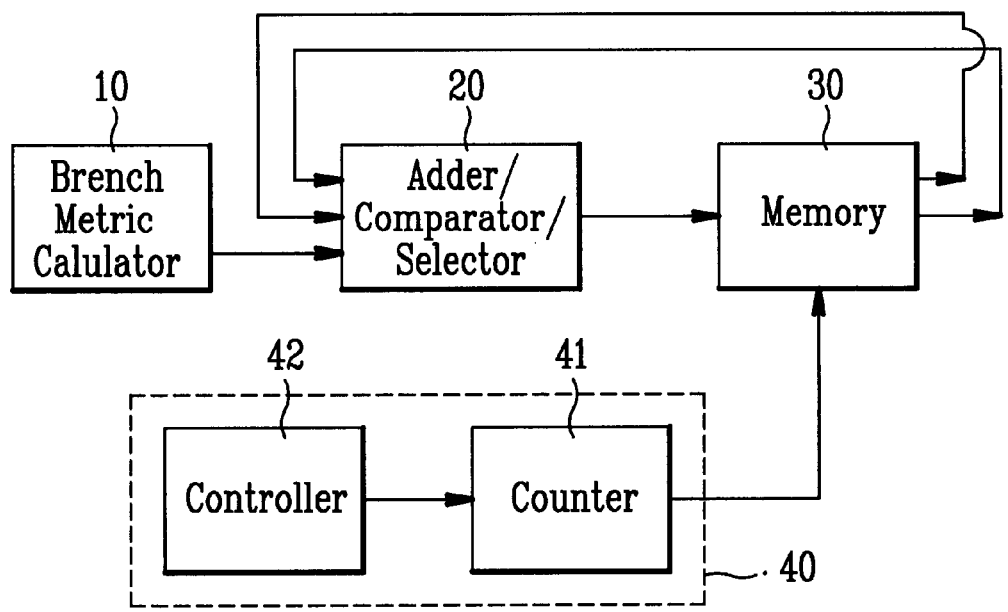
FIG. 1(a) shows a block diagram showing a portion of a viterbi decoder in the related art.
Figure 1B:
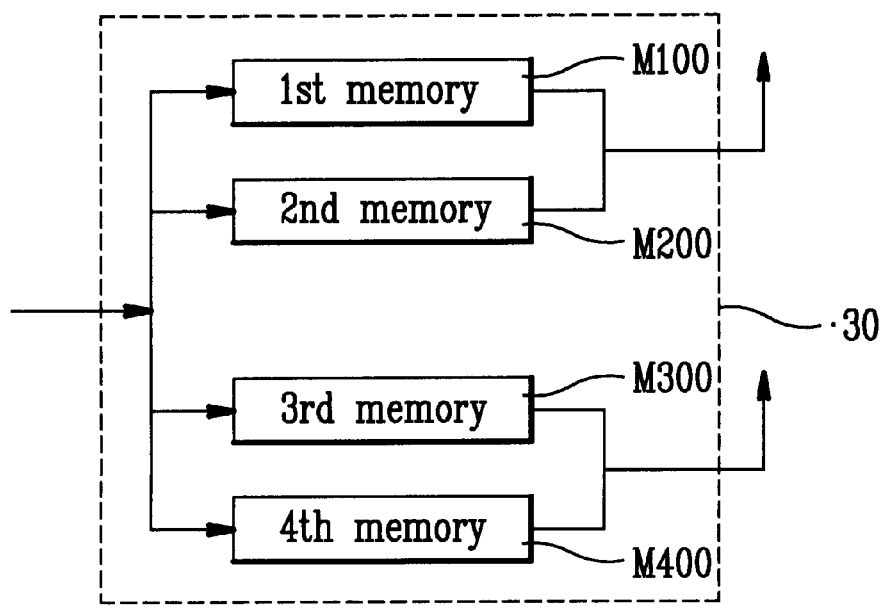
Figure 2:
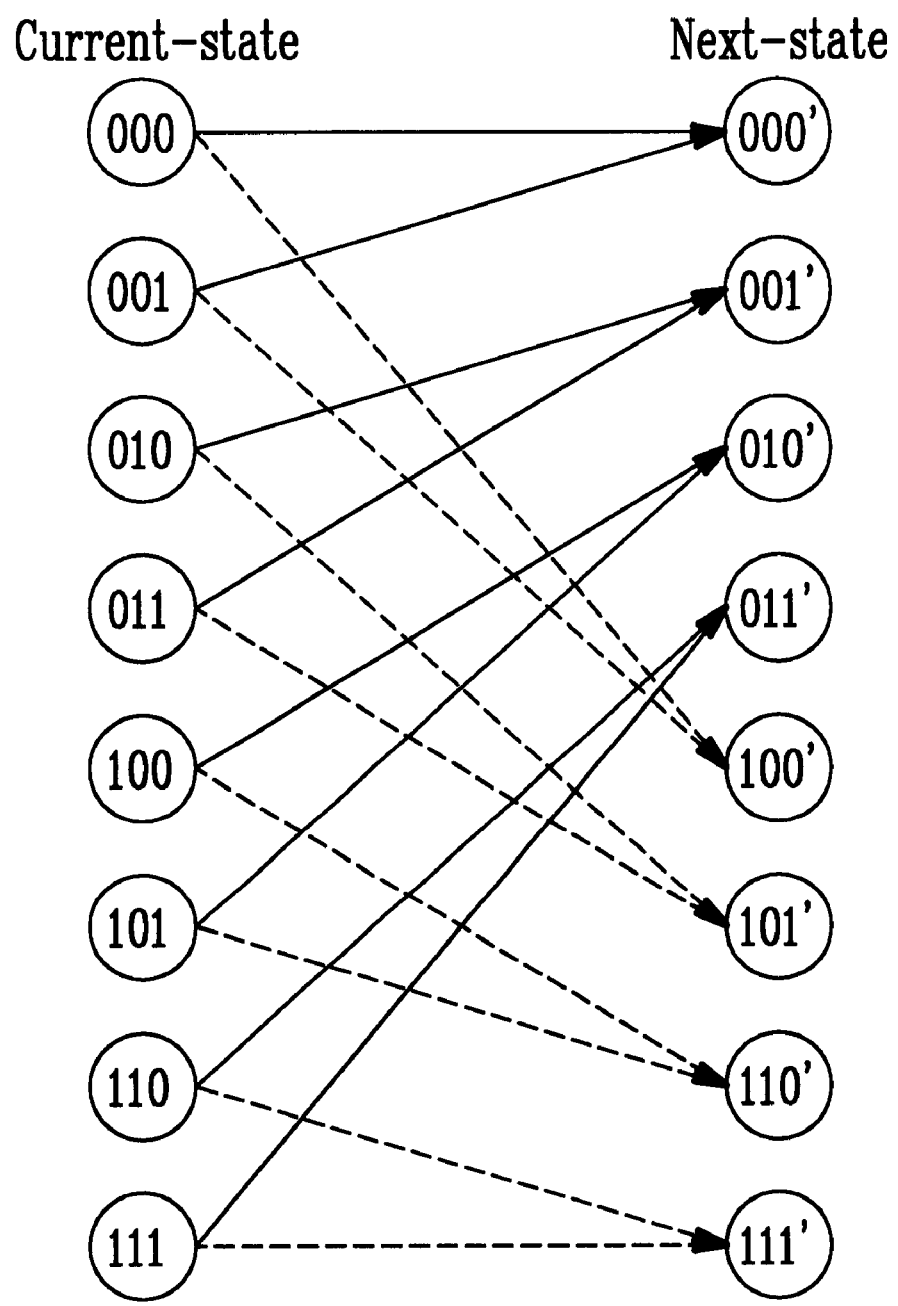
FIG. 2 is a trellis diagram of a state metric memory for a viterbi decoder.
Figure 3:
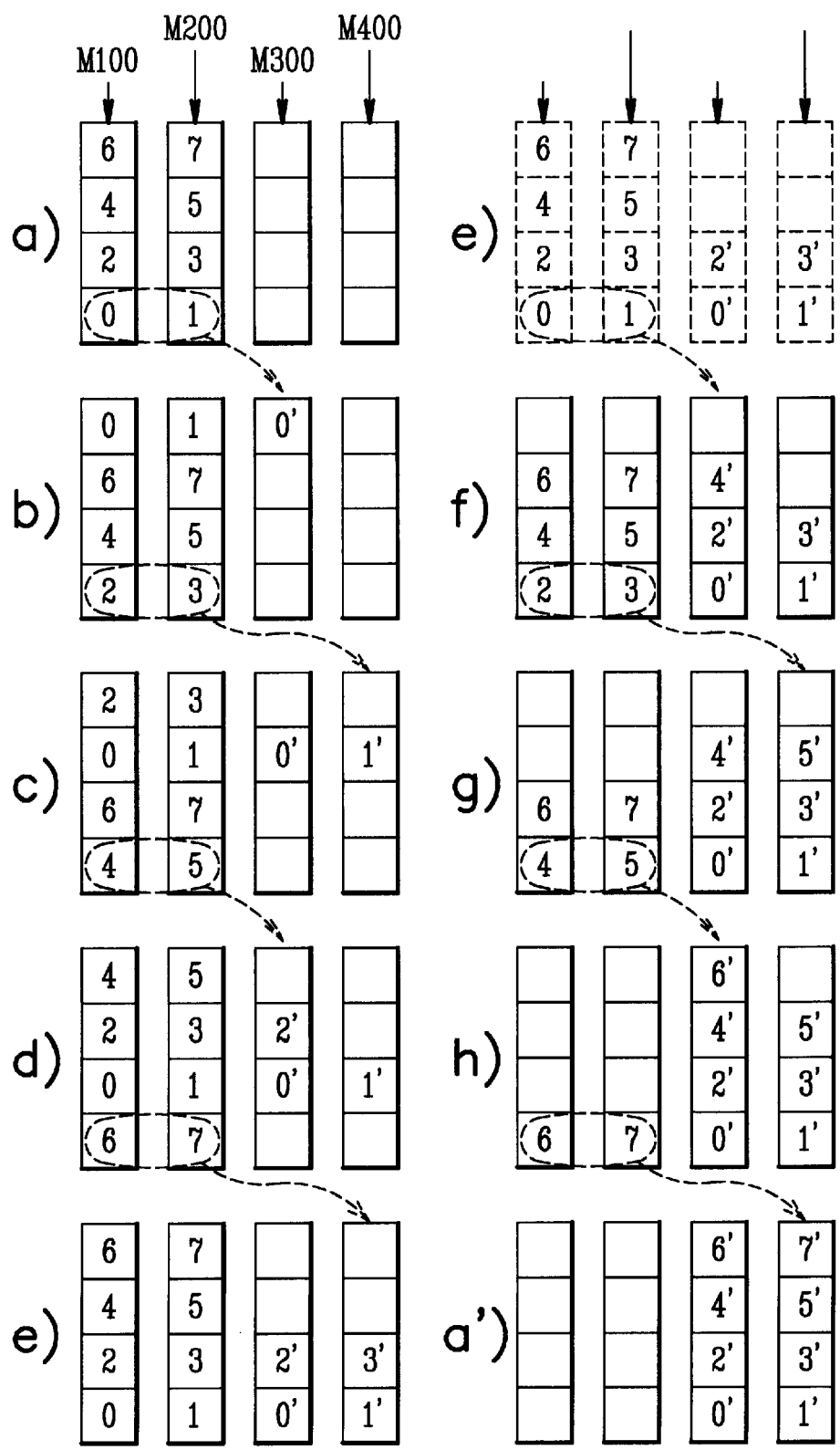
FIG. 3 is a diagram showing a sequential state transition process (a) to (a') of a state metric memory in the related art.

Moreover, in the conventional art as shown in FIG. 2, eight reading and writing operations from and to the memory must be executed for transposing the current-state metrics to the next-states by a state transition when the constraint length is 4. However, in the present invention, four reading and writing operations are executed since the next-state metrics are concurrently written in two memories.

Therefore, the present invention would provide an efficient viterbi decoding in communication system requiring the state metric memory of high speed/large capacity. Furthermore, implementation of the viterbi decoder by lightness/thinness/simplicity of communicative instruments is achieved since a limited memory can be used effectively.

The foregoing embodiments are merely exemplary and are not to be construed as limiting the present invention. The present teachings can be readily applied to other types of apparatuses. The description of the present invention is intended to be illustrative, and not to limit the scope of the claims. Many alternatives, modifications, and variations will be apparent to those skilled in the art.

What is claimed is:

1. A state metric memory of a viterbi decoder comprising:
    a metric calculator calculating and outputting a plurality of branch metrics from input code symbols and input hypotheses;
    a memory unit storing a plurality of initial current-state metrics and storing a plurality of next-state metrics, wherein the memory unit has a first and a second set of submemories;
    a path metric generator simultaneously producing at least two survival path metrics utilizing the branch metrics and the plurality of current-state metrics, and outputting each survival path metric as a next-state metric; and
    a controller outputting control signals to the memory unit designating the addresses for storing the current-state metrics and the next-state metrics, wherein the path metric generator adds a first branch metric and the current-state metric from one of the first or second set of submemories, and wherein the path metric generator concurrently adds a second branch metric and the current-state metric from the other of the first or second set of submemories, and compares the two path metrics to select the first survival path metric, and wherein the path metric generator adds the second branch metric and the current-state metric from one of the first or second set of submemories and concurrent adds the first branch metric and the current-state metric from the other of the first or second set of submemories, and compares the two path metrics to select the second survival path metric.

2. An apparatus of claim 1, wherein the memory unit simultaneously stores at least two next-state metrics.

3. An apparatus of claim 1, the metric calculator calculating the plurality of branch metrics utilizing a look-up table.

4. An apparatus of claim 1, wherein the memory unit further comprises:

a first submemory storing the plurality of initial current-state metrics and storing the plurality of next-state metrics according to the control signal from the controller;

a second submemory storing the plurality of initial current-state metrics and storing the plurality of next-state metrics according to the control signal from the controller;

a third submemory storing the plurality of initial current-state metrics and storing the plurality of next-state metrics according to the control signal from the controller; and a fourth submemory storing the plurality of initial current-state metrics and storing the plurality of next-state metrics according to the control signal from the controller.

5. An apparatus of claim 1, wherein the path metric generator outputs a first survival path metric by adding a first current-state metric and a first branch metric, and simultaneously adding a second current-state metric and a second branch metric to produce a first pair of two path metrics, said path metric generator comparing the first pair of two path metrics and selecting the first survival path metric; and wherein the path metric generator outputs a second survival path metric by adding the first current-state metric and the second branch metric, and simultaneously adding the second current-state metric and the first branch metric to produce a second pair of two path metrics, said path metric generator comparing the second pair of two path metrics and selecting the second survival path metric.

6. An apparatus of claim 5, wherein the path metric generator comprises:

a first ACS outputting the first survival path metric as a first next-state metric by adding the first current-state metric and the first branch metric, and simultaneously adding the second current-state metric and the second branch metric to produce two path metrics, said first ACS adding comparing the two path metrics and selecting the first survival path metric; and a second ACS outputting the second survival path metric as a second next-state metric by adding the first current-state metric and the second branch metric, and simultaneously adding the second current-state metric and the first branch metric to produce two path metrics, said second ACS comparing the two path metrics and selecting the second survival path metric.

7. An appratus of claim 6, wherein the memory unit comprises of at least four submemories, each submemory storing the plurality of initial current-state metrics and storing the plurality of next-state metrics according to the control signal from the controller.

8. An apparatus of claim 7, wherein the first ACS adds the first branch metric and a current-state metric read from either a first or a third submemories, and adds the second branch metric and a current-state metric read from either a second or a fourth submemories; and wherein the second ACS adds the second branch metric and a current-state metric read from either the first or third submemories, and adds the first branch metric and a current-state metric from either the second or fourth submemories.

9. An apparatus of claim 7, wherein the first ACS outputs the first survival path metric as the first next-state metric to either the first submemory or the second submemory; and the second ACS outputs the second survival path metric as a second next-state metric to either the third submemory or the fourth submemory.

10. An apparatus of claim 7, wherein a constraint length is four;

the first ACS adds a first current-state metric corresponding to a first submemory and the first branch metric, and simultaneously adds a second current-state metric corresponding to a second submemory and a second branch metric to produce two path metrics;

the second ACS adds the first current-state metric corresponding to the first submemory and the second branch metric, and simultaneously adding the second current-state metric corresponding to the second submemory and the first branch metric to produce two path metrics; and the controller outputs control signals to store the first next-state metric in the first submemory and the second next-state metric in a third submemory.

11. An apparatus of claim 7, wherein a constraint length is four;

the first ACS adds a third current-state metric corresponding to a first submemory and the first branch metric, and simultaneously adds a fourth current-state metric corresponding to a second submemory and a second branch metric to produce two path metrics;

the second ACS adds the third current-state metric corresponding to the first submemory and the second branch metric, and simultaneously adding the fourth current-state metric corresponding to the second submemory and the first branch metric to produce two path metrics; and the controller outputs control signals to store the first next-state metric in the second submemory and the second next-state metric in a fourth submemory.

12. An apparatus of claim 7, wherein a constraint length is four;

the first ACS adds a fifth current-state metric corresponding to a third submemory and the first branch metric, and simultaneously adds a sixth current-state metric corresponding to a fourth submemory and a second branch metric to produce two path metrics;

the second ACS adds the fifth current-state metric corresponding to the third submemory and the second branch metric, and simultaneously adding the sixth current-state metric corresponding to the fourth submemory and the first branch metric to produce two path metrics; and the controller outputs control signals to store the first next-state metric in a first submemory and the second next-state metric in the third submemory.

13. An apparatus of claim 7, wherein a constraint length is four;

the first ACS adds a seventh current-state metric corresponding to a third submemory and the first branch metric, and simultaneously adds an eighth current-state metric corresponding to a fourth submemory and a second branch metric to produce two path metrics;

the second ACS adds the seventh current-state metric corresponding to the third submemory and the second branch metric, and simultaneously adding the eighth current-state metric corresponding to the fourth submemory and the first branch metric to produce two path metrics; and the controller outputs control signals to store the first next-state metric in a second submemory and the second next-state metric in the fourth submemory.

14. An apparatus of claim 1, wherein the controller comprises:

a counter outputting the control signals designating the addresses for storing the current-state metrics and the next-state metrics; and a counter controller controlling the counter.

15. The apparatus of claim 1, wherein the controller designates the addresses so that each of the first and second sets of submemories has at least one submemory concurrently hold one of each of the current-state metrics and the next-state metrics during one-cycle of the current-state to next-state metrics exchange.

16. A decoding method using a state metric memory of a viterbi decoder, comprising:

calculating and outputting a plurality of branch metrics from input code symbols and input hypotheses;

storing a plurality of initial current-state metrics and storing concurrently a plurality of next-state metrics in a memory unit;

simultaneously producing at least two survival path metrics utilizing the branch metrics and the plurality of current-state metrics, and outputting each survival path metric as a next-state metric; and outputting control signals to the memory unit designating the addresses for storing the current-state metrics and the next-state metrics, wherein the outputting at least two survival path metrics comprises, outputting a first survival path metric as a first next-state metric by adding the first branch metric and the current-state metric from one of first or second set of submemories, simultaneously adding the second branch metric and the current-state metric from one of the first or second set of submemories, and comparing the two path metrics and selecting the first survival path metric.

17. A method of claim 16, wherein in the storing a plurality of next-state metrics, simultaneously storing at least two next-state metrics.

18. A method of claim 17, wherein the outputting at least two survival path metrics further comprises:

outputting a first survival path metric as a first next-state metric by adding the current-state metric and a first branch metric, simultaneously adding the current-state metric and a second branch metric to produce two path metrics, and comparing the two path metrics and selecting the first survival path metric; and outputting a second survival path metric as a second next-state metric by adding the current-state metric and the second branch metric, simultaneously adding the current-state metric and the first branch metric to produce two path metrics, and comparing the two path metrics and selecting the second survival path metric.

19. A method of claim 17, wherein the storing the metrics in the memory unit further comprises:

storing the plurality of initial current-state metrics and storing the plurality of next-state metrics in a first set of submemories in the memory unit according to the control signal from the controller; and storing the plurality of initial current-state metrics and storing the plurality of next-state metrics in a second set of submemories in the memory unit according to the control signal from the controller.

20. A method of claim 17, wherein the outputting at least two survival path metrics further comprises:

outputting a second survival path metric as a second next-state metric by adding the second branch metric and the current-state metric from one of the first or second set of submemories, simultaneously adding the first branch metric and the current-state metric from one of the first or second set of submemories, and comparing the two path metrics and selecting the second survival path metric.

21. A method of claim 20, wherein the outputting the first and second next-state metrics further comprises:

outputting the first survival path metric as the first next-state metric to the first set of submemory; and outputting the second survival path metric as a second next-state metric to the second set of submemory.

22. A state metric memory of a viterbi decoder comprising:

a metric calculator calculating and outputting a plurality of branch metrics from input code symbols and input hypotheses;

a memory unit storing a plurality of initial current-state metrics and storing a plurality of next-state metrics, wherein the memory unit comprises of at least four submemories, each submemory storing the plurality of initial current-state metrics and storing the plurality of next-state metrics;

a path metric generator simultaneously producing at least two survival path metrics utilizing the branch metrics and the plurality of current-state metrics, and outputting each survival path metric as a next-state metric, wherein the path metric generator comprises, a first ACS outputting a first survival path metric as a first next-state metric by adding the current-state metric and a first branch metric, and simultaneously adding the current-state metric and a second branch metric to produce two path metrics, said first ACS adding comparing the two path metrics and selecting the first survival path metric, and a second ACS outputting a second survival path metric as a second next-state metric by adding the current-state metric and the second branch metric, and simultaneously adding the current-state metric and the first branch metric to produce two path metrics, said second ACS comparing the two path metrics and selecting the second survival path metric; and a controller outputting control signals to the memory unit designating the addresses for storing the current-state metrics and the next-state metrics, wherein the first ACS adds the first branch metric and a current-state metric read from either a first or a third submemories, and adds the second branch metric and a current-state metric read from either a second or a fourth submemories, and wherein the second ACS adds the second branch metric and a current-state metric read from either the first or third submemories, and adds the first branch metric and a current-state metric from either the second or fourth submemories.

23. A decoding method using a state metric memory of a viterbi decoder, comprising:

calculating and outputting a plurality of branch metrics from input code symbols and input hypotheses;

storing a plurality of initial current-state metrics and concurrently storing a plurality of at least two next-state metrics in a memory unit;

concurrently producing at least two survival path metrics utilizing the branch metrics and the plurality of current-state metrics, and outputting each survival path metric as a next-state metric; and outputting control signals to the memory unit designating the addresses for storing the current-state metrics and the next-state metrics, and wherein the storing the metrics in the memory unit further comprises, storing the plurality of initial current-state metrics and storing the plurality of next-state metrics in a first set of submemories in the memory unit according to the control signal from the controller, and storing the plurality of initial current-state metrics and storing the plurality of next-state metrics in a second set of submemories in the memory unit according to the control signal from the controller.

24. A state metric memory of a viterbi decoder comprising:

a metric calculator calculating and outputting a plurality of branch metrics from input code symbols and input hypotheses;

a memory unit storing a plurality of initial current-state metrics and storing a plurality of next-state metrics;

a path metric generator simultaneously producing at least two survival path metrics utilizing the branch metrics and the plurality of current-state metrics, and outputting each survival path metric as a next-state metric; and a controller outputting control signals to the memory unit designating the addresses for storing the current-state metrics and the next-state metrics, wherein a memory space capable of storing all the current-state metrics is N, wherein the memory space capable of storing all the next-state metrics is N, and wherein the memory unit uses a first memory space of approximately $(5/4)*N$ to write the current and next-state metrics so that the memory unit accomplishes repeated state exchange of the current-state and next-state metrics, respectively, using the approximately $(5/4)*N$ first memory space.

25. The apparatus of claim 24, wherein for a constraint length of 4 of the viterbi decoder, only four reading and writing operations are executed for transposing the current-state metrics to the next-states metrics by a state transition since the next-state metrics are concurrently written into memories holding the current-state metrics.

26. The apparatus of claim 24, wherein the memory units include two pair of submemories and during the exchange of the current-state metrics and the next-state metrics, a sub-memory of each of the two pairs of submemories concurrently holds both the current-state metrics and the next-state metrics.

27. The apparatus of claim 26, wherein the path metric generator comprises:

a first ACS outputting a first survival path metric as a first next-state metric by adding a first current-state metric and a first branch metric, and simultaneously adding a second current-state metric and a second branch metric to produce two path metrics, said first ACS adding comparing the two path metrics and selecting the first survival path metric; and a second ACS outputting a second survival path metric as a second next-state metric by adding the first current-state metric and the second branch metric, and simultaneously adding the second current-state metric and the first branch metric to produce two path metrics, said second ACS comparing the two path metrics and selecting the second survival path metric.

* * * * *